United States Patent
Iseki et al.

(10) Patent No.: US 6,893,805 B2
(45) Date of Patent: May 17, 2005

(54) SUBSTRATE PROCESSING APPARATUS AND SUBSTRATE PROCESSING METHOD

(75) Inventors: Izuru Iseki, Kyoto (JP); Tsutomu Ueyama, Kyoto (JP)

(73) Assignee: Dainippon Screen Mfg. Co., Ltd. (JP)

(*) Notice: Subject to any disclaimer, the term of this patent is extended or adjusted under 35 U.S.C. 154(b) by 74 days.

(21) Appl. No.: 10/256,120

(22) Filed: Sep. 25, 2002

(65) Prior Publication Data

US 2003/0064609 A1 Apr. 3, 2003

(30) Foreign Application Priority Data

Oct. 3, 2001 (JP) .................................... 2001-307745

(51) Int. Cl.$^7$ ............................................. H01L 21/31
(52) U.S. Cl. ................. 430/330; 430/322; 430/313; 430/317; 118/715; 118/729; 438/782; 438/780; 438/778
(58) Field of Search ................. 118/715, 729; 430/322, 313, 317, 330; 438/782, 780, 778

(56) References Cited

U.S. PATENT DOCUMENTS

| 5,674,659 A | 10/1997 | Matsuo et al. ........... 430/270.1 |
| 6,010,570 A | * 1/2000 | Motoda et al. ............. 118/323 |
| 6,361,927 B1 | * 3/2002 | Park ........................... 430/321 |

FOREIGN PATENT DOCUMENTS

| JP | 06-222562 | 8/1994 |
| JP | 10-135198 | 5/1998 |

* cited by examiner

Primary Examiner—John A. McPherson
Assistant Examiner—Daborah Chacko-Davis
(74) Attorney, Agent, or Firm—Ostrolenk, Faber, Gerb & Soffen, LLP

(57) ABSTRACT

A substrate processing apparatus provided with: a coating processing section for supplying a coating solution to a substrate; a pressure processing section for pressurizing a coating film formed on the substrate; and a developing processing section for supplying a developing solution to the substrate having the coating film selectively exposed to light with the use of an exposure mask. The pressure processing section may be arranged such that a pressing plate having a flat face is brought into pressure contact with the coating film.

17 Claims, 13 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus for and a substrate processing method of forming a coating film pattern on any of a variety of substrates such as a semiconductor wafer, a glass substrate for liquid-crystal-display-panel, a glass substrate for plasma-display-panel, a photo mask substrate, an optical-disk substrate, a magnetic-disk substrate, a magneto-optical-disk substrate, a print-circuit board and the like.

2. Description of Related Art

The process of forming multi-layer wirings on the surface of a semiconductor wafer comprises: a step of coating, with a photosensitive SOD (Spin on dielectric) solution, a semiconductor wafer having wiring patterns of aluminum or copper formed thereon, and drying the SOD solution to form an SOD film; a CMP (chemical and mechanical polishing) step of flattening the SOD film; a step of executing an exposure processing and a developing processing on the SOD film thus flattened, thereby to form openings for interlayer wirings; and a step of embedding wiring metals in the openings.

There are cases where the SOD film is formed with the use of, instead of a photo sensitive SOD solution, a normal SOD solution to which photosensitivity is not being given. In such a case, the SOD film is first flattened by a CMP step, a resist film is then formed on this SOD film, an exposure processing and a developing processing are then executed on this resist film to form a pattern, and the SOD film is then etched with the resist film serving as an etching mask. Thus, openings for interlayer wirings are formed in the SOD film.

The SOD film flattening processing is required for precisely executing an exposure processing on a photosensitive SOD film or a resist film in a desired pattern by an exposure unit. More specifically, when the SOD film surface is uneven and the pattern to be formed is very fine, this fine pattern is not properly focused on the SOD film surface or the resist film surface, so that the pattern image becomes vague or obscure.

When forming a fine-pattern resist film, the focusing range (depth of field) at the time of exposure is narrow. The resist film thickness is therefore required to be thin. In this connection, the CMP step is inevitable before the resist film is coated.

At the CMP step, however, contamination occurs due to a polishing agent. Accordingly, a so-called post-CMP cleaning is required. This disadvantageously not only takes much processing time, but also increases the production cost. Further, if cleaning is not sufficient, the polishing agent contamination remains on the semiconductor wafer surface. This exerts adverse effects on the subsequent process, thus disadvantageously lowering the production yield.

Further, due to the characteristics of a polishing processing by the CMP step, there is a tendency that the SOD film height from the semiconductor wafer surface is large at the peripheral edge of the wafer and small at the center portion thereof. Accordingly, the flatness cannot be assured for a large-size semiconductor wafer (having a diameter of, for example, 300 mm).

SUMMARY OF THE INVENTION

It is an object of the present invention to provide a substrate processing apparatus which can quickly and economically flatten a coating film on a substrate, thus not only improving the productivity of substrate products, but also reducing the production cost thereof.

It is another object of the present invention to provide a substrate processing method which can quickly and economically flatten a coating film on a substrate, thus not only improving the productivity of substrate products, but also reducing the production cost thereof.

A substrate processing apparatus according to the present invention comprises: a coating processing section (27) for supplying a coating solution to a substrate (WF); a pressure processing section (26) for pressurizing a coating film formed on the substrate; and a developing processing section (28) for supplying a developing solution to the substrate having the coating film selectively exposed to light with the use of an exposure mask. In this section, SUMMARY OF THE INVENTION, alphabets and numerals in parentheses refer to those of corresponding component elements in embodiments to be discussed later. However, it should not be understood that the present invention is construed as limited to these embodiments.

The coating processing section may be arranged to supply a photosensitive or nonphotosensitive coating solution to the substrate. Further, the coating processing section may be arranged to supply, to the substrate, photosensitive and nonphotosensitive coating solutions as switched.

The developing processing section is arranged to execute a developing processing on a photosensitive coating film.

According to the arrangement above-mentioned, a coating film can be formed by supplying a coating solution on to a substrate, and this coating film can be pressurized and shaped into a desired form (for example a flat face). With the use of an exposure mask in a desired pattern, an exposure processing is selectively executed on the coating film to which photosensitivity has been given, or on another photosensitive coating film (for example, resist film) formed on the nonphotosensitive coating film, and a developing solution is then supplied to the substrate. Thus, the coating film in a desired pattern can be formed on the substrate.

Thus, according to the present invention, the coating film on the substrate can be flattened without executing a CMP processing. This not only remarkably shortens the time required for the substrate processing, but also reduces the cost required for the substrate processing.

Further, even though the substrate is great in size, the coating film can be shaped to a desired surface configuration (flat surface for example) throughout the substrate with no problem encountered with the CMP processing.

The pressure processing section preferably causes a pressing plate (S) having a flat face to be brought into pressure contact with the coating film, by moving the pressing plate and/or the substrate toward each other.

According to the arrangement above-mentioned, the coating film surface can be flattened by closely contacting the pressing plate having a flat face, with the coating film.

Preferably, the pressure processing section (26) comprises a pressing plate holding mechanism (62) for holding the pressing plate, a substrate holding mechanism (61) for holding the substrate, and a pressurizing mechanism (67) for moving the pressing plate holding mechanism and/or the substrate holding mechanism toward each other. In such a case, the substrate processing apparatus preferably further comprises a removing mechanism (29) for removing the pressing plate from the substrate.

According to the arrangement above-mentioned, the pressing plate held by the pressing plate holding mechanism is pressurized as being in contact with the substrate held by the substrate holding mechanism, thus enabling the coating film surface to be flattened. Then, the pressing plate bonded to the substrate is removed by the removal mechanism. Thus, there is obtained the substrate having the coating film of which surface has been flattened. When such a series of processings are executed with a pressing plate changed for each substrate, this not only prevents particles from being transferred from one substrate to another, but also prevents film remainings attached to the pressing plate from damaging the coating film on another substrate.

The removing mechanism may be formed by a mechanism (67) for moving the pressing plate holding mechanism and/or the substrate holding mechanism away from each other with the pressing plate held by the pressing plate holding mechanism.

The removing mechanism may be disposed separately from the pressure processing section. In such a case, the pressing plate holding mechanism or the substrate holding mechanism releases the pressing plate holding state or the substrate holding state after the pressing plate has been bonded to the coating film on the substrate.

Preferably, the coating processing section comprises a foundation film coating solution supplying portion (73) for supplying a foundation film coating solution (for example, a nonphotosensitive coating solution) onto the substrate, and a photosensitive coating solution supplying portion (74) for supplying a photosensitive coating solution onto the substrate having a foundation film formed thereon. In such a case, the substrate processing apparatus preferably further comprises an etching processing section (40) for etching the foundation film present under a photosensitive coating film with the photosensitive coating film serving as a mask.

According to the arrangement above-mentioned, a coating film (for example a nonphotosensitive SOD film) as a foundation film is formed on the substrate, a photosensitive coating film (for example a resist film) is further formed on the foundation film, and the foundation film is etched with the photosensitive coating film serving as a mask. Thus, the foundation film can be patterned in a desired pattern. In this case, when a pressure processing is previously executed on the foundation film to flatten the surface thereof by the pressure processing section, the photosensitive coating film can be formed thinly on this flattened foundation film. Then, when the thin photosensitive coating film is exposed to light and then developed, this photosensitive coating film can serve as a highly precise etching mask.

Preferably, the coating processing section is arranged to supply, to the substrate, a coating solution for forming a porous coating film.

According to the arrangement above-mentioned, a porous coating film can be formed on the substrate. For polishing a coating film by a CMP processing, a porous coating film cannot be used because the coating film must have certain strength. According to the present invention, however, the coating film is flattened by a pressure processing, thus enabling a porous coating film to be used. Because of its low dielectric constant, a porous coating film has excellent properties as an interlayer insulating film for example.

These and other features, objects, advantages and effects of the present invention will be more fully apparent from the following detailed description set forth below when taken in conjunction with the accompanying drawings.

DESCRIPTION OF THE PREFERRED EMBODIMENTS

Figure 1:
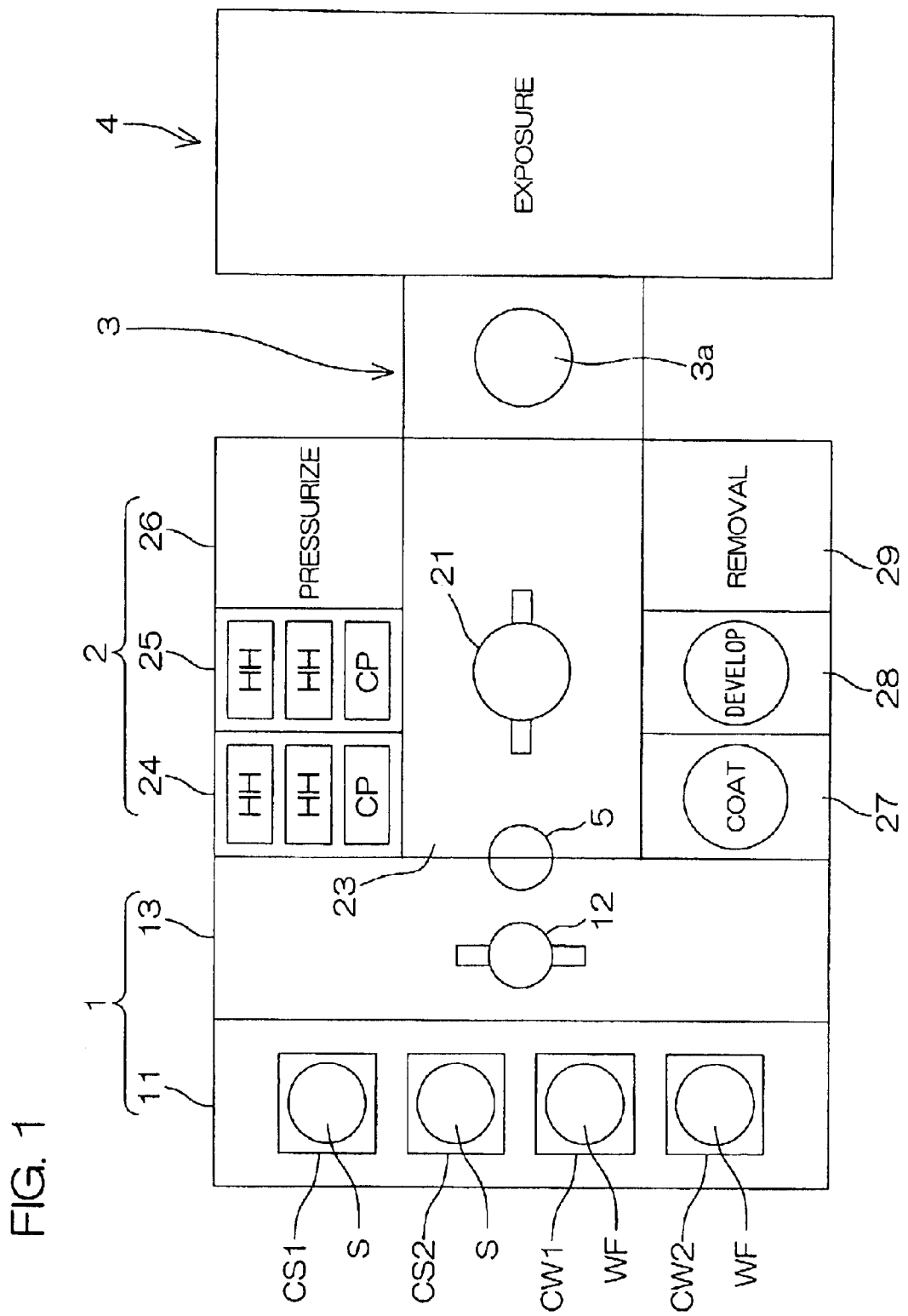
FIG. 1 is a schematic plan view illustrating the layout of a substrate processing apparatus according to an embodiment of the present invention.

FIG. 1 is a schematic plan view illustrating the layout of a substrate processing apparatus according to an embodiment of the present invention. This substrate processing apparatus is arranged to execute processings on a substrate WF such as a semiconductor wafer or the like, and comprises an indexer section 1 and a substrate processing section 2 combined therewith. An exposure unit 4 is connected to the substrate processing section 2 through an interface section 3.

The indexer section 1 has a cassette placing section 11 in which cassettes CW1, CW2, CS1, CS2 are placed as arranged in a predetermined direction. Each of the cassettes CW1, CW2 can hold substrates WF in multiple stages. Each of the cassettes CS1, CS2 can house, in multiple stages, pressing plates S each of which will be brought into contact with a coating film formed on the surface of a substrate WF to flatten the coating film.

Disposed at one side of the cassette placing section 11 is an indexer robot 12 movable in the alignment direction of the cassettes CW1, CW2, CS1, CS2.

Disposed in the substrate processing section 2 is a linear conveyance passage 23 extending from the vicinity of an intermediate portion of a linear conveyance passage 13 in which the indexer robot 12 travels, the passage 23 being substantially at right angles to the passage 13. A main conveyance robot 21 is disposed in the linear conveyance passage 23. At one side of the linear conveyance passage 23, heating processing sections 24, 25 and a pressure processing section 26 are disposed along the linear conveyance passage 23. At the other side of the linear conveyance passage 23, a coating processing section 27, a developing processing section 28 and a removal processing section 29 are disposed along the linear conveyance passage 23. The main conveyance robot 21 can reciprocate in the linear conveyance passage 23. Also, the main conveyance robot 21 can carry a substrate WF or a pressing plate S in and out from the heating processing section 24, 25, the pressure processing section 26, the coating processing section 27, the developing processing section 28 and the removal processing section 29.

A substrate WF and a pressing plate S are transferred between the indexer robot 12 and the main conveyance robot 21 via a temporary placing stand 5 disposed in the vicinity of the portion where the linear conveyance passage 13 and the linear conveyance passage 23 are joined to each other.

Each of the heating processing sections 24, 25 has hot plates HH and cool plates CP vertically arranged as stacked in multiple stages. For example, the cool plates CP are disposed at the lowest stage, while the hot plates HH are disposed in two laminated stages on the cool plates CP.

The pressure processing section 26 is arranged to pressurize a pressing plate S as being contact with the surface of a substrate WF. The coating processing section 27 is arranged to supply a coating solution such as an SOD solution, a resist solution or the like to the surface of a substrate WF. The developing processing section 28 is arranged to develop a photosensitive coating film after exposed to light in a predetermined pattern by the exposure unit 4. The removal processing section 29 is arranged to remove a pressing plate S bonded to a substrate WF by the pressure processing section 26.

A substrate WF is for example a substantially disk-like silicon substrate. A pressing plate S is a flat plate of quartz having sizes, for example, greater than the inner peripheral edge of the edge cut of the substrate WF (preferably, greater than the outer peripheral edge of the substrate WF), and has a flat surface to be contact with a coating film of the substrate WF. This flat surface is polished and the quartz directly comes in contact with the coating film. The flat surface which comes in contact with the coating film, may be coated with a film of fluoroplastics. The edge cut refers to that peripheral zone of the substrate WF where devices are not being formed. The edge cut is set in the form of a ring having a width of about several mm formed inwardly from the circumference of the active face (where devices are being formed) of the substrate WF.

Figure 2:
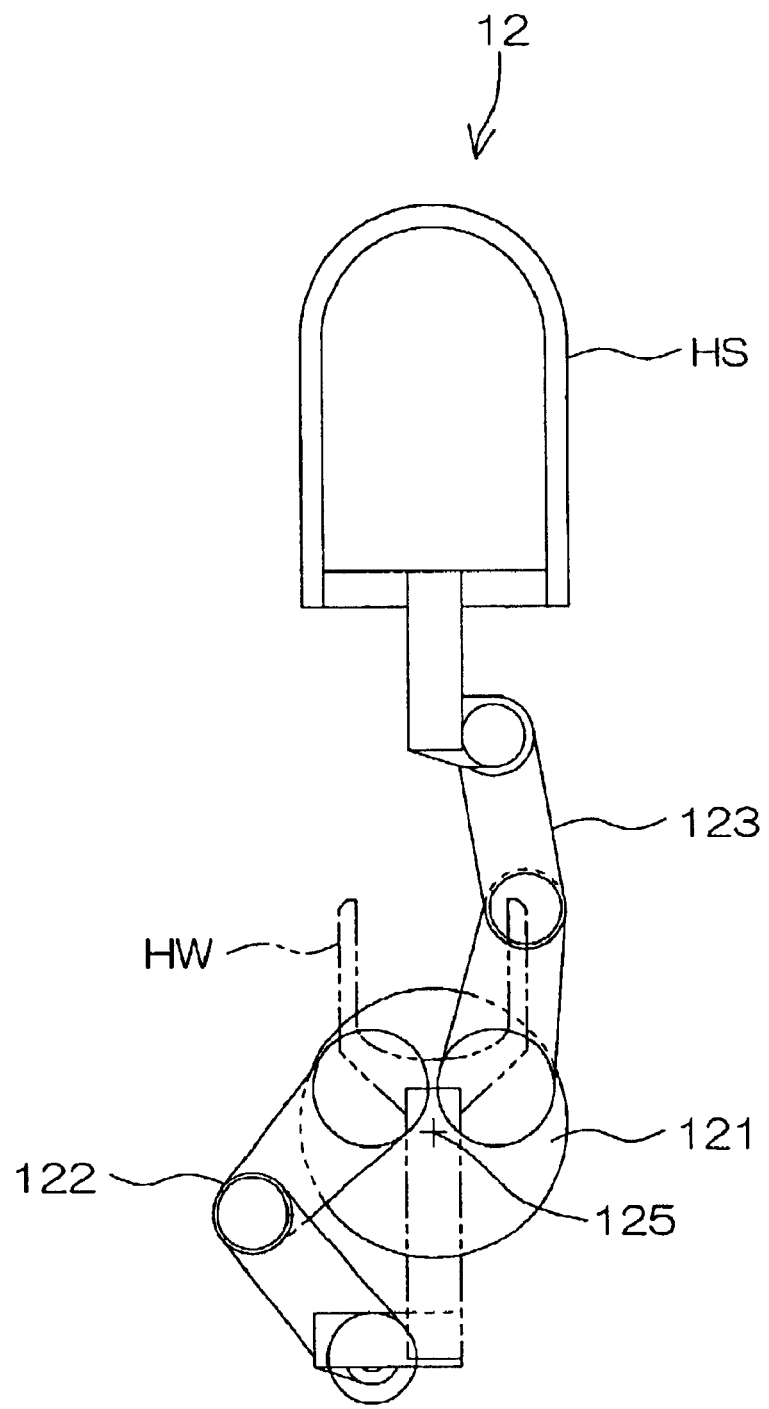
FIG. 2 is a plan view illustrating the arrangement of an indexer robot.

FIG. 2 is a plan view illustrating the arrangement of the indexer robot 12. The indexer robot 12 is disposed linearly movably back and forth in the cassette aligning direction, and comprises a base portion 121 and a pair of multiarticular arms 122, 123 attached thereto. The base portion 121 is connected to a lifting mechanism (not shown) and a rotational driving mechanism (not shown) so as to be vertically movable and rotatable around a vertical axis of rotation 125.

One multiarticular arm 122 is connected to a hand HW for holding and supporting a substrate WF from under and is arranged to horizontally move the hand HW toward and away from the axis of rotation 125 of the base portion 121. The other multiarticular arm 123 is connected to the hand HS for holding a pressing plate S, and is arranged to horizontally move the hand HS toward and away from the axis of rotation 125 of the base portion 121.

According to the arrangement above-mentioned, the indexer robot 12 is moved to the front of one of the cassettes CW1, CW2, CS1, CS2 placed in the cassette placing section 11 and faces the hand HW, HS toward this cassette. Then, the multiarticular arm 122, 123 advances or retreats the hand HW, HS to or from the cassette, thus enabling a substrate WF or a pressing plate S to be carried in or out from the cassette.

Now, it is supposed that unprocessed substrates WF are housed in the cassette CW1 and processed substrates WF are housed in the cassette CW2. In the indexer robot 12 moved up to the front of the cassette CW1, the multiarticular arm 122 advances the hand HW toward the cassette CW1, causing the hand HW to get into the inside thereof. Thereafter, the base portion 121 is slightly lifted such that the hand HW scoops up and holds one of the substrates WF in the cassette CW1. Then, the multiarticular arm 122 is driven to cause the hand HW to be retreated from the cassette CW1. Thus, an unprocessed substrate WF is carried out from the cassette CW1. The indexer robot 12 is then moved up to the temporary placing stand 5 and the base portion 121 is rotated such that the hand HW faces the temporary placing stand 5. Then, the base portion 121 is vertically moved and the multiarticular arm 122 is operated to advance or retreat the hand HW. Thus, the unprocessed substrate WF is placed on the temporary placing stand 5.

When the main conveyance robot 21 places a processed substrate WF on the temporary placing stand 5, the indexer robot 12 scoops up this processed substrate WF from the temporary placing stand 5 with the hand HW. Then, the indexer robot 12 is moved up to the front of the cassette CW 2 and the base portion 121 is rotated such that the hand HW faces the cassette CW2. Then, the multiarticular arm 122 is driven to cause the hand HW to get into the cassette CW2. Then, the base portion 121 is slightly lowered such that the processed substrate WF is placed on a shelf in the cassette CW2.

The indexer robot 12 also executes similar processings for the cassettes CS1, CS2 in which pressing plates S are housed. Now, it is supposed that unused pressing plates S are housed in the cassette CS1 and used pressing plates S are housed in the cassette CS2. In this case, the indexer robot 12 carries out, with the hand HS, an unused pressing plate S from the cassette CS1 and places it on the temporary placing stand 5. Then, the indexer robot 12 carries, with the hand HS, an used pressing plate S placed on the temporary placing stand 5 by the main conveyance robot 21, in the cassette CS2.

The main conveyance robot 21 has an arrangement similar to that of the indexer robot 12. The main conveyance robot 21 1o has a hand for holding a substrate WF and a hand for holding a pressing plate S. There is a case where the main conveyance robot 21 transfers a substrate WF and a pressing plate bonded to each other. In this case, the hand for the pressing plate S is used for holding the bonded pair of substrate WF and the pressing plate S.

Figure 3:
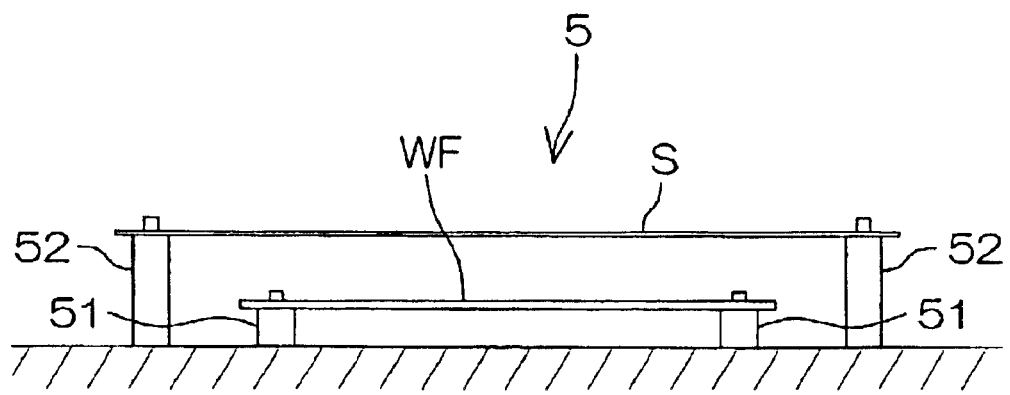
FIG. 3 is a side view illustrating the arrangement of a temporary placing stand.

FIG. 3 is a side view illustrating the arrangement of the temporary placing stand 5. The temporary placing stand 5 has a plurality of support pins 51 for supporting the peripheral edge of a substrate WF, and a plurality of support pins 52 for supporting the peripheral edge of a pressing plate S. The support pins 52 are disposed outside of the support pins 51, and have a height higher than that of the support pins 51. When a substrate WF and a pressing plate S are respectively supported by the support pins 51, 52, the pressing plate S and the substrate WF are disposed as vertically separated from each other as shown in FIG. 3.

Figure 4:
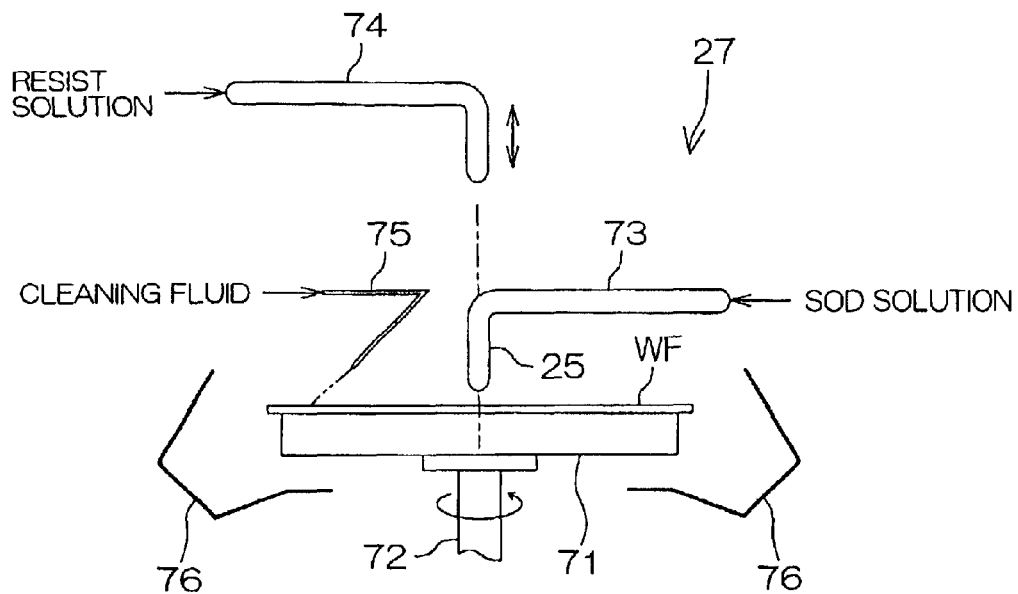
FIG. 4 is a schematic side view illustrating the arrangement of a coating processing section.

FIG. 4 is a schematic side view illustrating the arrangement of the coating processing section 27. The coating processing section 27 comprises a disk-like spin chuck 71 for adsorbing and holding a substrate WF, a rotational shaft 72 for rotating the spin chuck 71, an SOD solution discharge nozzle 73 for supplying an SOD solution as a coating solution to a substrate WF, a resist solution discharge nozzle 74 for supplying a resist solution also as a coating solution to a substrate WF, a cleaning fluid discharge nozzle 75 for discharging a cleaning fluid to the peripheral portion of a substrate WF for edge rinsing, and a scattering preventing cup 76 for preventing a coating solution, a cleaning fluid and the like from scattering around. Disposed in the top of the spin chuck 71 is an inlet port (not shown) for sucking, under vacuum, a substrate WF.

The SOD solution discharge nozzle 73 and the resist solution discharge nozzle 74 are vertically movable. Each of the nozzles 73, 74 can be moved between a retreat position retreated away from a position above the substrate WF, and a processing position in close vicinity to the substrate WF above the axis of rotation thereof (i.e., the axis of rotation of the spin chuck 71).

When a rotational force is given to the rotational shaft 72 with the spin chuck 71 sucking, under vacuum, a substrate WF with its active face upwardly oriented, the substrate WF is rotated. With the substrate WF thus rotated, a coating solution is supplied to the center of rotation of the substrate WF by the SOD solution discharge nozzle 73 or the resist solution discharge nozzle 74. In such a case, a centrifugal force generated by the rotation of the substrate WF causes the coating solution to be applied to the substrate WF in its entirety from the center thereof. A coating solution scattering outside of the substrate WF is discharged from a discharging pipe (not shown) through the scattering preventing cup 76. After the entire face of the substrate WF has been coated with the coating solution, a cleaning fluid is supplied from the cleaning fluid discharge nozzle 75. Thus, the coating solution stuck to the peripheral edge of the substrate WF is washed away.

The SOD solution supplied to the SOD solution discharge nozzle 73 may be nonphotosensitive or photosensitive. When a photosensitive SOD solution is supplied to a substrate WF from the SOD solution discharge nozzle 73, the resist solution discharge nozzle 74 is not necessarily required.

Figure 5:
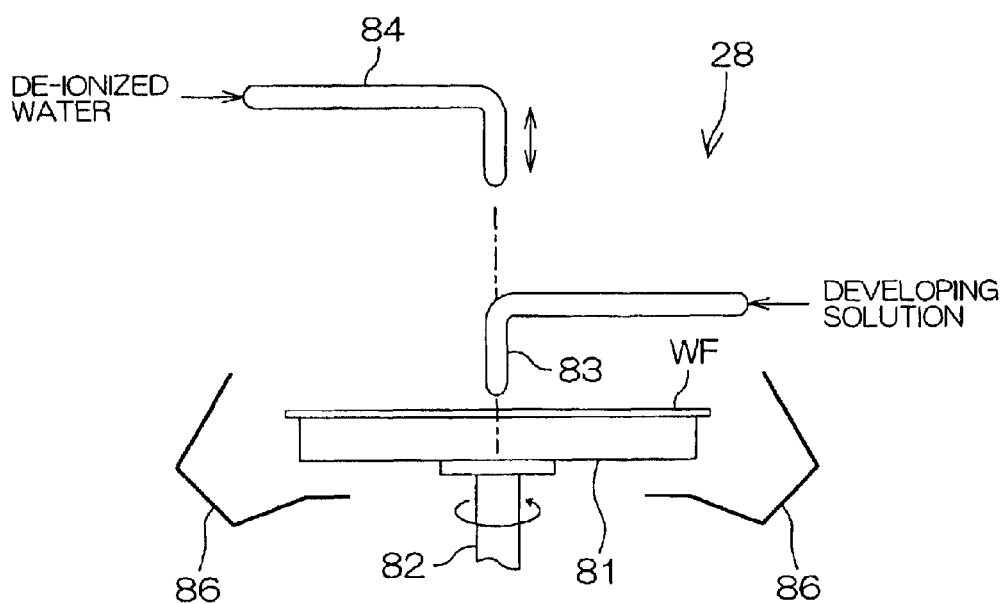
FIG. 5 is a schematic side view illustrating the arrangement of a developing processing section.

FIG. 5 is a schematic side view illustrating the arrangement of the developing processing section 28. The developing processing section 28 comprises a spin chuck 81 arranged to suck, under vacuum, a substrate WF with its active face upwardly oriented and to hold the substrate WF substantially horizontally, a rotational shaft 82 for rotating the spin chuck 81 around a vertical axis, a developing solution discharge nozzle 83 for supplying a developing solution to a substrate WF held by the spin chuck 81, a de-ionized water discharge nozzle 84 for supplying de-ionized water to a substrate WF held by the spin chuck 81, and a scattering preventing cup 86 for receiving the developing solution or de-ionized water discharged from a substrate WF by the centrifugal force, thus preventing the developing solution or de-ionized water from scattering around.

The developing solution discharge nozzle 83 and the de-ionized water discharge nozzle 84 are vertically movable. Each of the nozzles 83, 84 can be moved between a retreat position retreated away from the space above the spin chuck 81, and a processing position in close vicinity to the substrate WF above the axis of rotation of the spin chuck 81.

According to the arrangement above-mentioned, when the developing solution or de-ionized water is supplied to the substrate WF at its center of rotation while the spin chuck 81 is rotated around the vertical axis, the developing solution or de-ionized water can be supplied to the whole surface of the substrate WF under the action of centrifugal force. More specifically, the photosensitive coating film (photosensitive SOD film or resist film) on the substrate WF can be developed by supplying a developing solution to this coating film from the developing solution discharge nozzle 83, and the progress of the developing processing can be thereafter stopped by supplying de-ionized water to the substrate WF from the de-ionized water discharge nozzle 84.

Figure 6:
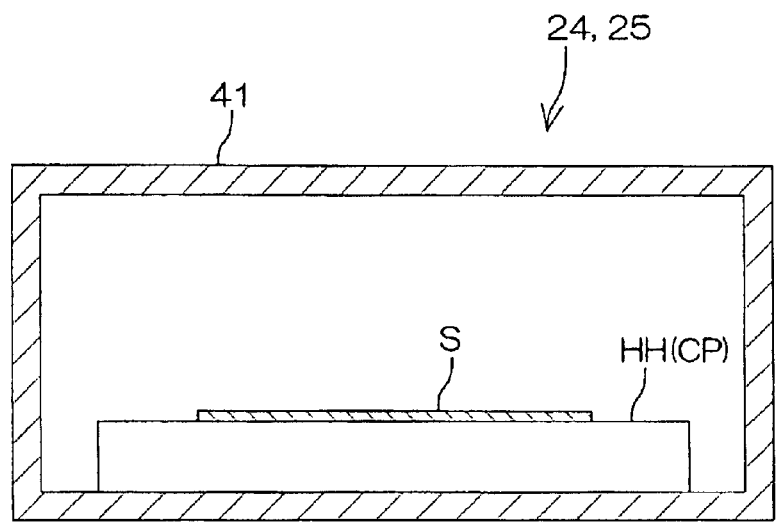
FIG. 6 is a schematic section view illustrating the arrangement of a heating processing section.

FIG. 6 is a schematic section view illustrating the arrangement of a hot plate or a cool plate in the heating processing section 24, 25. For example, a hot plate HH is of the vacuum sucking type and has a suction port formed in the surface thereof. The hot plate HH is housed in an openable chamber 41. The hot plate HH is previously heated to a predetermined temperature. A substrate WF is vacuum-sucked and held by the surface of the hot plate HH, and the chamber 41 is then closed so that the substrate WF is subjected to a baking processing.

A cool plate CP has an arrangement similar to that of the hot plate HH. Provision is made such that a substrate WF is sucked and held by the cool plate CP, instead of the hot plate HH, of which temperature has been adjusted to a predetermined low temperature (e.g., the room temperature).

Figure 7:
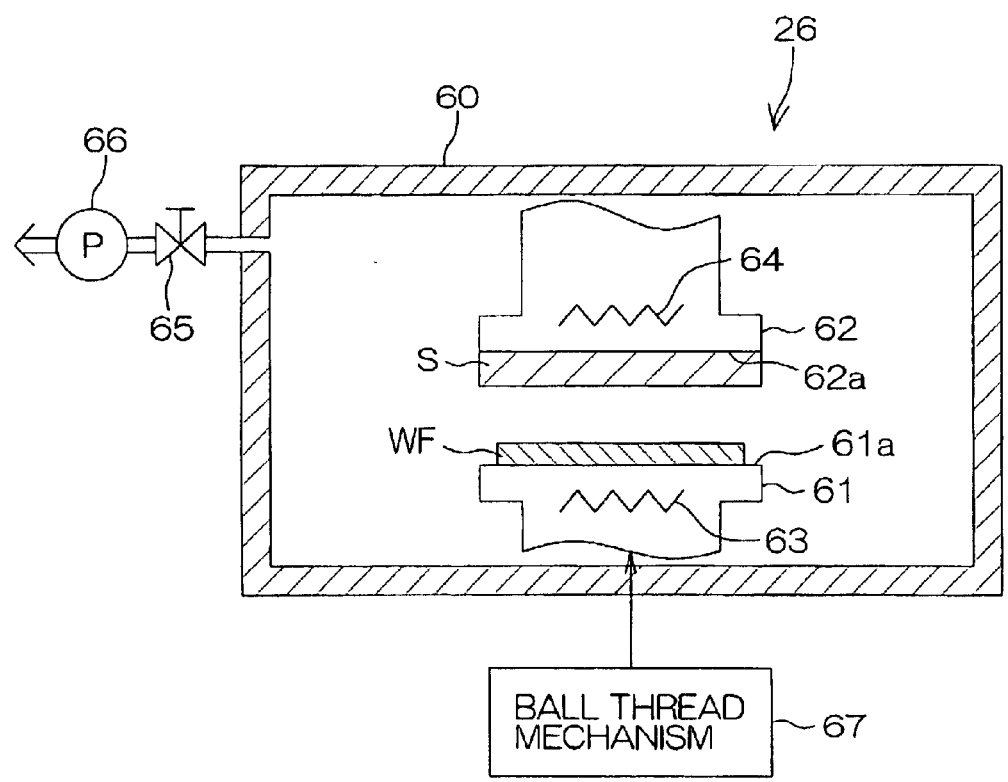
FIG. 7 is a schematic section view illustrating the arrangement of a pressure processing section.

FIG. 7 is a schematic section view illustrating the arrangement of the pressure processing section 26. The pressure processing section 26 has a processing chamber 60, in which a substrate holding stage 61 and a pressing plate holding stage 62 are disposed vertically opposite to each other. The substrate holding stage 61 and the pressing plate holding stage 62 respectively have holding faces 61a, 62a for holding a substrate WF and a pressing plate S, respectively, according to an electrostatic chucking system. These holding faces 61a, 62a are opposite to each other. At least one of the substrate holding stage 61 and the pressing plate holding stage 62 is vertically movable by a ball thread mechanism 67 or the like (In FIG. 7, the substrate holding stage 61 is vertically movable). Accordingly, the substrate holding stage 61 and/or the pressing plate holding stage 62 are movable toward or away from each other.

The processing chamber 60 is hermetically sealed and connected to a vacuum pump 66 through an exhaust valve 65. Thus, the inside of the processing chamber 60 is depressurized. With the processing chamber 60 depressurized, the substrate holding stage 61 which holds a substrate WF, and the pressing plate holding stage 62 which holds a pressing plate S, are moved toward each other. Then, the pressing plate S is brought into pressure contact with the coating film formed on the surface of the substrate WF, causing the coating film to be flattened.

After the pressing plate S has been brought into contact with and bonded to the substrate WF, the pressing plate holding stage 62 releases its pressing plate holding state and is then separated from the pressing plate S. The substrate holding stage 61 and the pressing plate holding stage 62 incorporate heating mechanisms 63, 64 such as a heater, a lamp or the like. Thus, the substrate WF and the pressing plate S can be heated, as necessary, at the time of pressurization.

Figure 8:
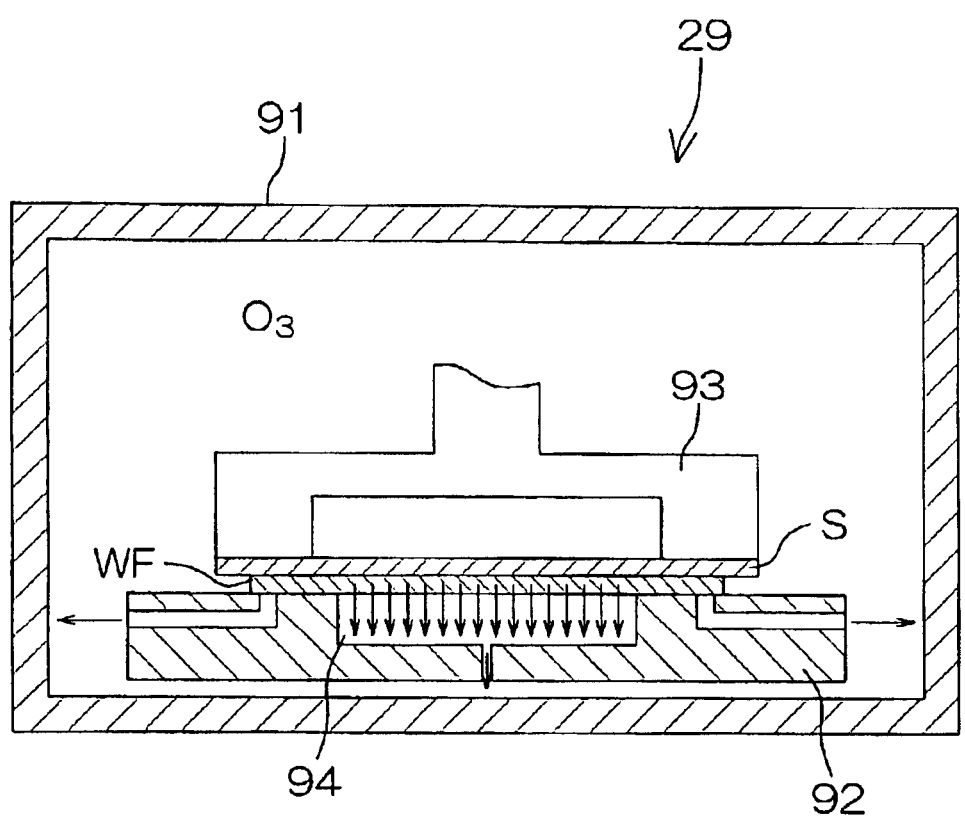
FIG. 8 is a schematic section view illustrating the arrangement of a removal processing section.

FIG. 8 is a schematic section view illustrating the arrangement of the removal processing section 29. This removal processing section 29 is arranged to separate or remove the pressing plate S from the substrate WF, and comprises a processing chamber 91 which houses a removing plate 92 of the vacuum-suction type and a pressing plate holding portion 93 for sucking and holding a pressing plate S. The removing plate 92 is provided in the center portion thereof with a recess portion 94. Provision is made such that the recess portion 94 is sucked and exhausted.

The pressing plate holding portion 93 is vertically movable. When a substrate WF and a pressing plate S bonded to each other are placed on the removing plate 92, the pressing plate holding portion 93 is lowered until its sucking face (underside) comes in contact with the pressing plate S. In this state, the pressing plate holding portion 93 sucks the pressing plate S under vacuum, while the recess portion 94 of the removing plate 92 is sucked and exhausted. In this state, when the pressing plate holding portion 93 is lifted to pull up the pressing plate S, the pressing plate S is separated and removed from the substrate WF.

When a vacuum is being formed inside of the processing chamber 91 at the time the pressing plate S is removed from the substrate WF, this involves the likelihood that the substrate WF is broken due to electrification. This problem can be solved for example by filling the inside of the processing chamber 91 with an ozone atmosphere.

Figure 9:
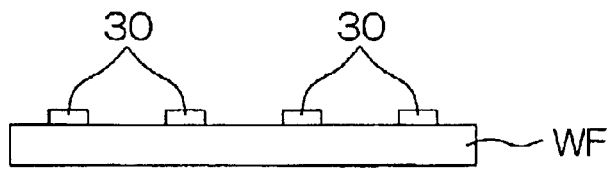
FIG. 9(a) to FIG. 9(f) are section views illustrating an example of substrate processing steps.
Figure 9:
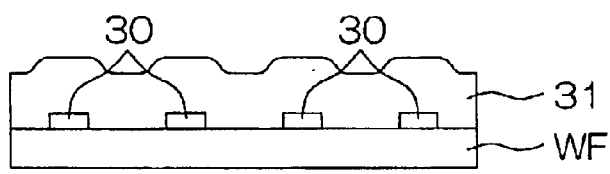
Figure 9:
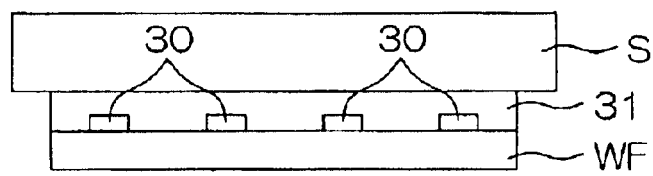
Figure 9:
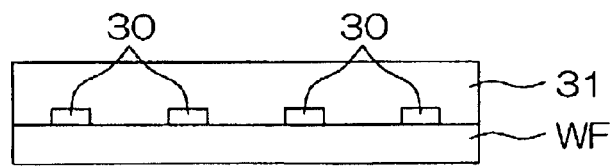
Figure 9:
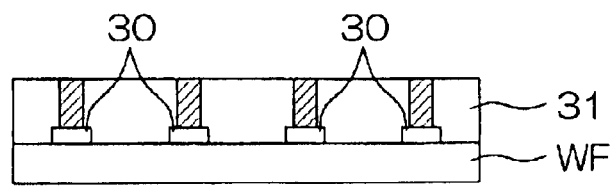
Figure 9:
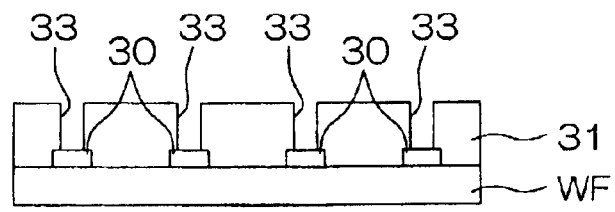
Figure 10:
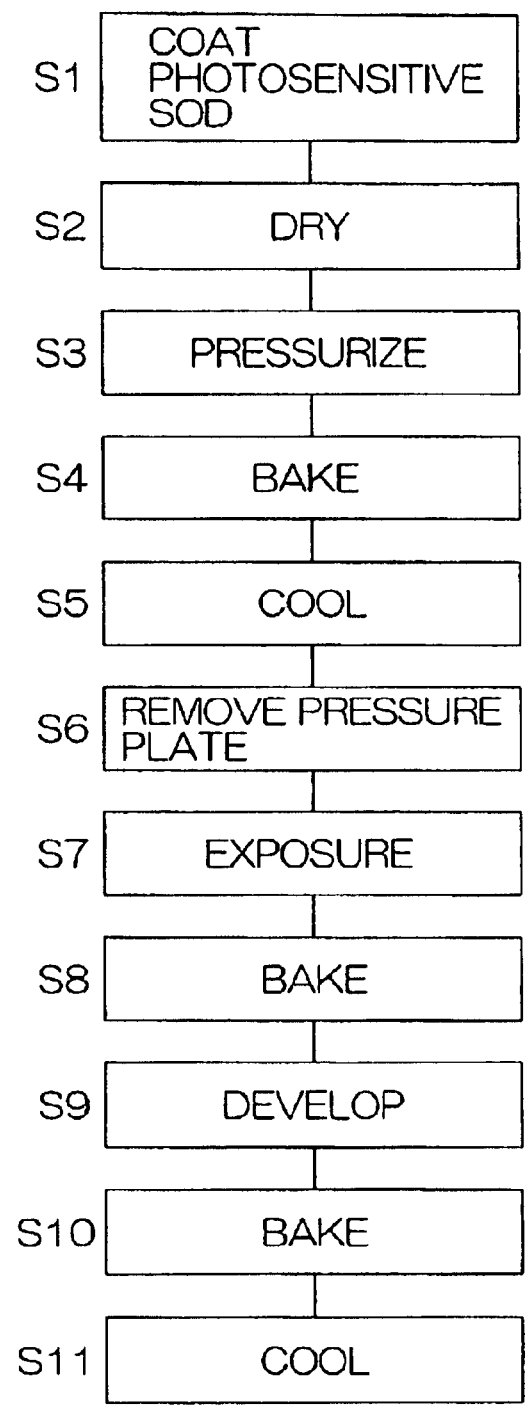
FIG. 10 is a flow chart illustrating the substrate processing steps in FIG. 9(a) to FIG. 9(f)

FIG. 9(a) to FIG. 9(f) are section views illustrating an example of processing steps executed by the substrate processing apparatus according to the embodiment above-mentioned. FIG. 10 is a flow chart illustrating these processing steps. Substrates WF each having metallic wirings 30 of aluminum or copper, are housed in the cassette CW1 arranged to house unprocessed substrates WF (FIG. 9(a)). An unprocessed substrate WF is carried out from the cassette CW1 and placed on the temporary placing stand 5 by the indexer robot 12. This substrate WF is received and carried in the coating processing section 27 by the main conveyance robot 21. In the coating processing section 27, a photosensitive SOD solution is supplied to coat the substrate WF (Step S1).

The main conveyance robot 21 carries out the coated substrate WF from the coating processing section 27 and carries it in a hot plate HH in the heating processing section 24 or 25. There, the substrate WF is dried until the SOD solution on the surface of the substrate WF becomes gelatinous (until a suitable viscosity is obtained) (Step S2). At this time, concave and convex portion are generated on the surface of an SOD coating film 31 on the substrate WF as shown in FIG. 9(b).

The dried substrate WF is carried out from the hot plate HH and carried in the pressure processing section 26 by the main conveyance robot 21. By this time, the indexer robot 12 has carried out an unused pressing plate S from the cassette CS1 and placed it on the temporary placing stand 5, and the main conveyance robot 21 has received this unused pressing plate S and carried it in the pressure processing section 26.

The pressing plate S carried in the pressure processing section 26 is held by the pressing plate holding stage 62, and the substrate WF also carried in the pressure processing section 26 is held by the substrate holding stage 61. At the pressure processing section 26, the substrate WF and the pressing plate S are brought into contact with and pressurized to each other as shown in FIG. 9(c) (Step S3). At this time, in the pressure processing section 26, the inside of the processing chamber 60 is depressurized, and the heating mechanisms 63, 64 are energized to heat the substrate WF and the pressing plate S. Accordingly, the surface of the SOD coating film 31 is flattened.

The main conveyance robot 21 carries out the substrate WF and the pressing plate S bonded to each other from the pressure processing section 26, and carries them in the hot plate HH in the heating processing section 24 or 25, where the substrate WF and the pressing plate S bonded to each other are subjected to a heating processing (Step S4). At this time, either the substrate WF or the pressing plate S may be sucked under vacuum by the hot plate HH. This heating processing changes the composition of the SOD coating film 31 to that suitable for exposure to light.

Upon completion of the heating processing, the main conveyance robot 21 carries out the substrate WF and the pressing plate S bonded to each other from the hot plate HH, and carries them in the cool plate CP of the heating processing section 24 or 25 for cooling (Step S5).

The substrate WF and the pressing plate S thus cooled are carried in the removal processing section 29, where the pressing plate S is removed from the substrate WF (Step S6). This provides a state shown in FIG. 9(d) in which the SOD coating film 31 having a flat surface is formed on the substrate WF.

Thereafter, the main conveyance robot 21 carries out the substrate WF from the removal processing section 29 and delivers it to a temporary placing stand 3a disposed in the interface section 3. Further, the main conveyance robot 21 carries out the used pressing plate S from the removal processing section 29, and delivers it to the temporary placing stand 5. The pressing plate S delivered to the temporary placing stand 5 is to be carried in the cassette CS2 by the indexer robot 12.

The substrate WF delivered to the temporary placing stand 3a in the interface section 3, is carried in the exposure unit 4, in which the photosensitive SOD coating film 31 is exposed to light in a predetermined exposure pattern (Step S7) Thus, the portions hatched in FIG. 9(e) (portions above the metallic wirings) are exposed to light. When photosensitivity has been given to the SOD coating film 31 by a positive-type photosensitive material, these hatched portions are to be dissolved by a developing processing to be executed later.

The substrate WF after exposed to light is delivered to the temporary placing stand 3a of the interface section 3. The main conveyance robot 21 receives the exposure-processed substrate WF from the temporary placing stand 3a, and carries it in the hot plate HH of the heating processing section 24 or 25. Thus, there is executed a heating processing for aiding the photochemical reaction of the photosensitive SOD (Step S8).

After this heating processing, the main conveyance robot 21 carries out the substrate WF from the hot plate HH, and carries it in the developing processing section 28. In the developing processing section 28, a developing solution is supplied to the substrate WF having the photosensitive SOD coating film formed thereon, such that the SOD in the light-exposed portions is dissolved (Step S9). Thereafter, pure water is supplied to the substrate WF to stop the developing processing and to remove dissolved matter. Thus, openings 33 for interlayer wirings are formed in the SOD coating film 31 as shown in FIG. 9(f).

Thereafter, the main conveyance robot 21 carries out the develop-processed substrate WF from the developing processing section 28, and carries it in the hot plate HH in the heating processing section 24 or 25, in which the SOD coating film is baked (Step S10). Then, the main conveyance robot 21 carries out the heat-processed substrate WF from the hot plate HH, and carries it in the cool plate CP in the heating processing section 24 or 25, in which the substrate WF is cooled to a room temperature (Step S11).

The cool-processed substrate WF is carried out from the cool plate CP and placed on the temporary placing stand 5 by the main conveyance robot 21. This substrate WF is to be housed in the cassette CW2 by the indexer robot 12.

Then, the substrate WF is conveyed to another substrate processing apparatus, in which there is executed a processing for embedding metal such as copper in the interlayer wiring openings 33 formed in the SOD coating film 31. Thus, the embedded metals are contacted with the metallic wirings 30 thereunder.

Figure 11:
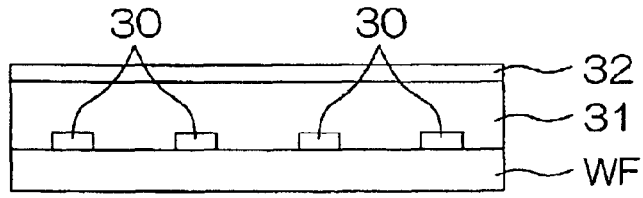
FIG. 11(a) to FIG. 11(d) are section views illustrating another example of substrate processing steps.
Figure 11:
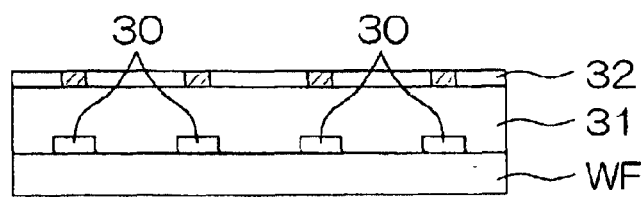
Figure 11:
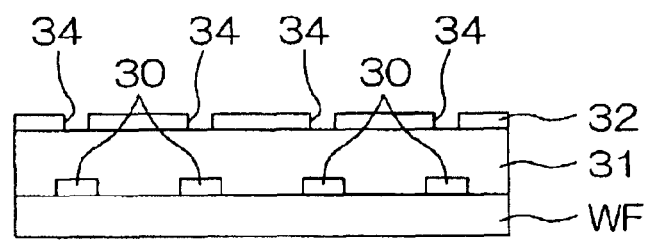
Figure 11:
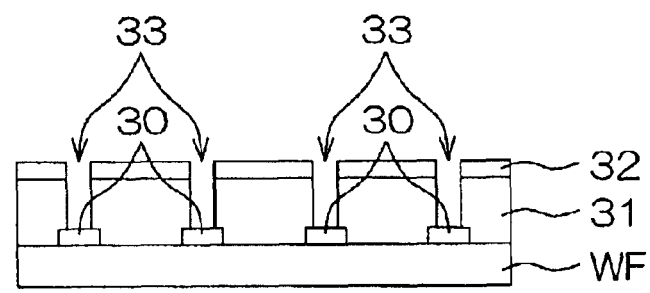
Figure 12:
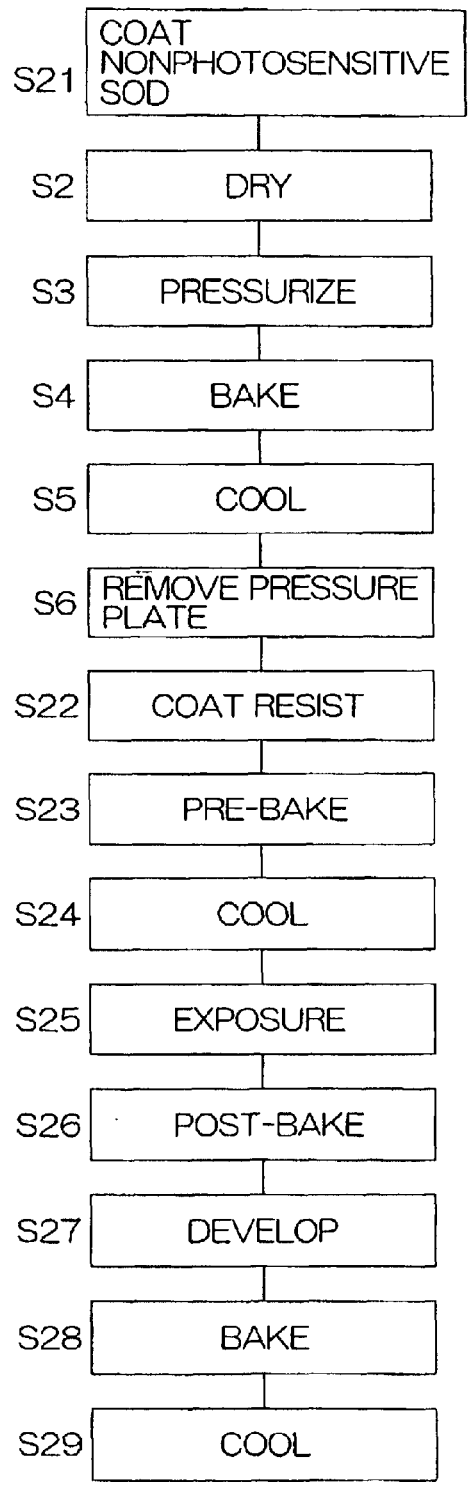
FIG. 12 is a flow chart illustrating the substrate processing steps in FIG. 11(a) to FIG. 11(d)

FIG. 11(a) to FIG. 11(d) are section views illustrating another substrate processing steps which can be executed by the substrate processing apparatus of the embodiment above-mentioned. FIG. 12 is a flow chart illustrating these processing steps. In FIG. 11(a) to FIG. 11(d), like parts are designated by like reference numerals used in FIG. 9(a) to FIG. 9(f). Similarly, like processing steps in FIG. 12 are designated by like reference numerals used in FIG. 10.

According to this example, a substrate WF is coated with a nonphotosensitive SOD solution in the coating processing section 27 (Step S21), the coated substrate WF is then dried by a hot plate HH until the SOD solution becomes gelatinous (Step S2), and the substrate WF is then carried in the pressure processing section 26, in which a pressing plate S is pressurized and bonded to the SOD coating film 31 (Step S3). Then, the substrate WF and the pressing plate S bonded to each other are carried in a hot plate HH for a baking processing (Step S4). Then, the substrate WF and the pressing plate S are moved to a cool plate CP for cooling to a room temperature (Step S5), and then carried in the removal processing section 29, where the pressing plate S is removed and separated from the substrate WF (Step S6).

Then, the pressing plate S is delivered to the temporary placing stand 5 by the main conveyance robot 21 and then housed in the cassette CS2 by the indexer robot 12.

On the other hand, the main conveyance robot 21 again carries the substrate WF in the coating processing section 27. In the coating processing section 27, the substrate WF is coated with a resist solution supplied onto the SOD coating film 31 (Step S22). At this time, a thin resist film 32 can be formed on the SOD coating film 31 as shown in FIG. 11(a) because the SOD coating film 31 has been pressurized and flattened by the pressing plate S.

Then, the main conveyance robot 21 carries out the substrate WF from the coating processing section 27, and carries it in the hot plate HH in the heating processing section 24 or 25, where a pre-baking processing is executed for drying the resist (Step S23). Then, the main conveyance robot 21 carries out the substrate WF from the hot plate HH and carries it in a cool plate CP for cooling the substrate WF to a room temperature (Step S24).

Then, the main conveyance robot 21 carries out the substrate WF from the cool plate CP, and delivers it to the temporary placing stand 3a of the interface section 3. The substrate WF is then carried in the exposure unit 4, where the substrate WF is exposed to light with the use of a predetermined exposure mask (Step S25). Thus, as shown by hatched portions in FIG. 11(b), those portions of the resist film 32 above the metallic wirings 30, are selectively exposed to light. When the resist is of the positive type, these exposure portions will be dissolved by a developing processing to be executed later.

The substrate WF after exposed to light is delivered to the temporary placing stand 3a of the interface section 3. The main conveyance robot 21 carries this substrate WF in the hot plate HH of the heating processing section 24 or 25 for a heating processing (post-baking) for aiding the photo-chemical reaction (Step S26).

The post-baked substrate WF is carried out from the hot plate HH and carried in the developing processing section 28 by the main conveyance robot 21. In the developing processing section 28, a developing solution is supplied to the resist film 32 on the substrate WF. Thus, the exposure portions of the resist film 32 are dissolved to form openings 34 as shown in FIG. 11(c) (Step 27). The main conveyance robot 21 carries out the substrate WF from the developing processing section 28, and carries it in the hot plate HH of the heating processing section 24 or 25, where a baking processing is executed for baking the resist film 32 (Step S28).

The main conveyance robot 21 carries out the substrate WF from the hot plate HH. and then carries it in the cool plate CP for cooling to a room temperature (Step S29). The substrate WF thus cooled is placed on the temporary placing stand 5 by the main conveyance robot 21. This substrate WF is to be housed in the cassette CW2 by the indexer robot 12.

Then, the substrate WF is conveyed to another apparatus, where there is executed a processing for etching, with the resist film 32 serving as a mask, the SOD film 31 as a foundation film present under the resist film 32 with the use of an etching solution such as HF (hydrofluoric acid) or BHF (buffered hydrofluoric acid). Thus, as shown in FIG. 11(d), openings 33 for interlayer wirings are formed in the SOD film 31.

Figure 13:
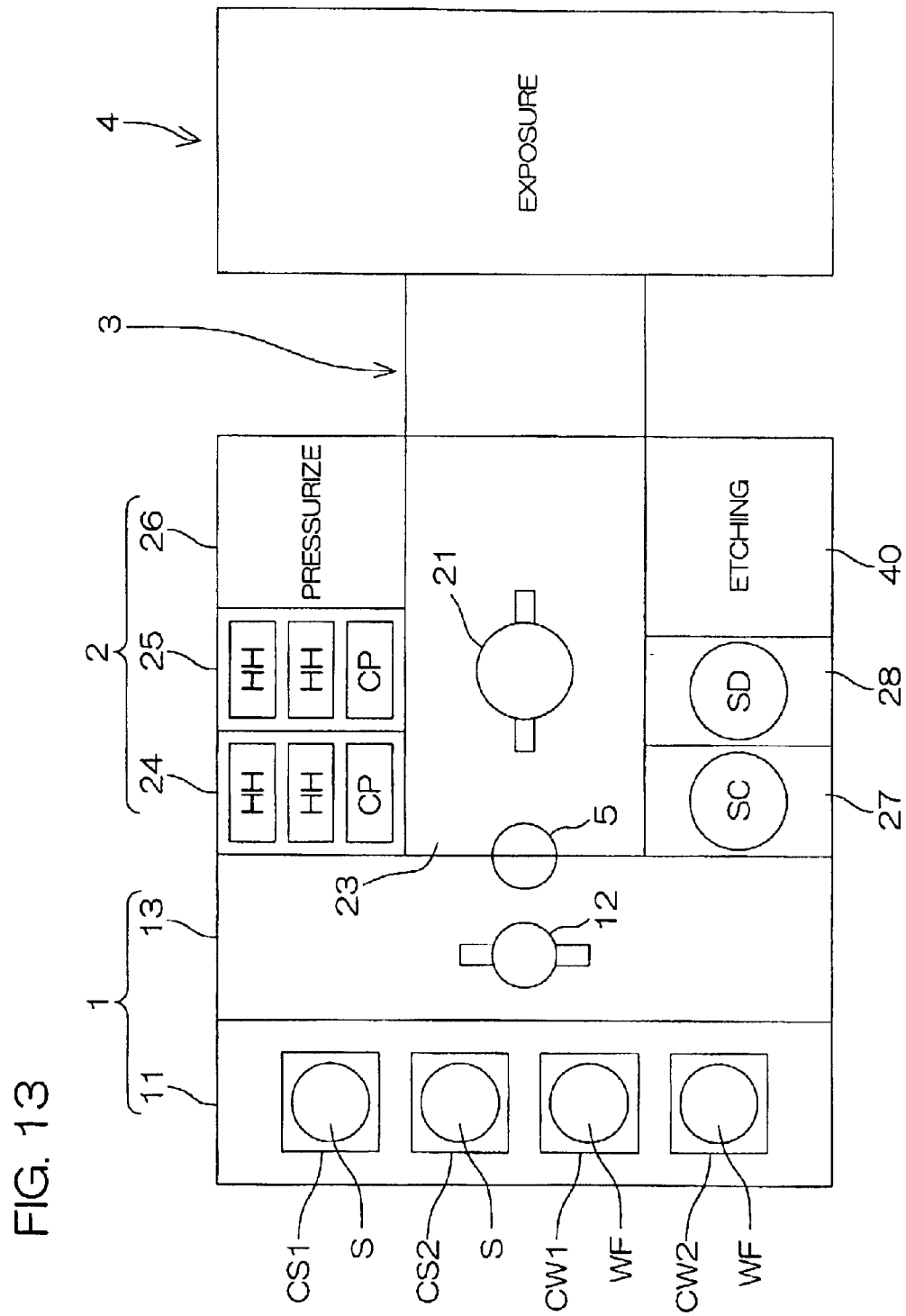
FIG. 13 is a schematic plan view illustrating the layout of a substrate processing apparatus according to another embodiment of the present invention.

FIG. 13 is a schematic plan view illustrating the layout of a substrate processing apparatus according to another embodiment of the present invention. In FIG. 13, like parts are designated by like reference numerals used in FIG. 1. In the following description, reference is again made to FIG. 2 to FIG. 8, and FIG. 11(a) to FIG. 11(d).

The substrate processing apparatus of this embodiment has an etching processing section 40 instead of the removal processing section 29. The removal or separation of the pressing plate S from the substrate WF, is executed in a pressure processing section 26. According to this another embodiment, even after the pressing plate S has been brought into contact with the substrate WF, a pressing plate holding stage 62 in the pressure processing section 26 does not release the pressing plate holding state. While maintaining the pressing plate holding state, the pressing plate holding stage 62 upwardly moves and retreats from a substrate holding stage 61. This removes or separates the pressing plate S from the substrate WF.

Figure 14:
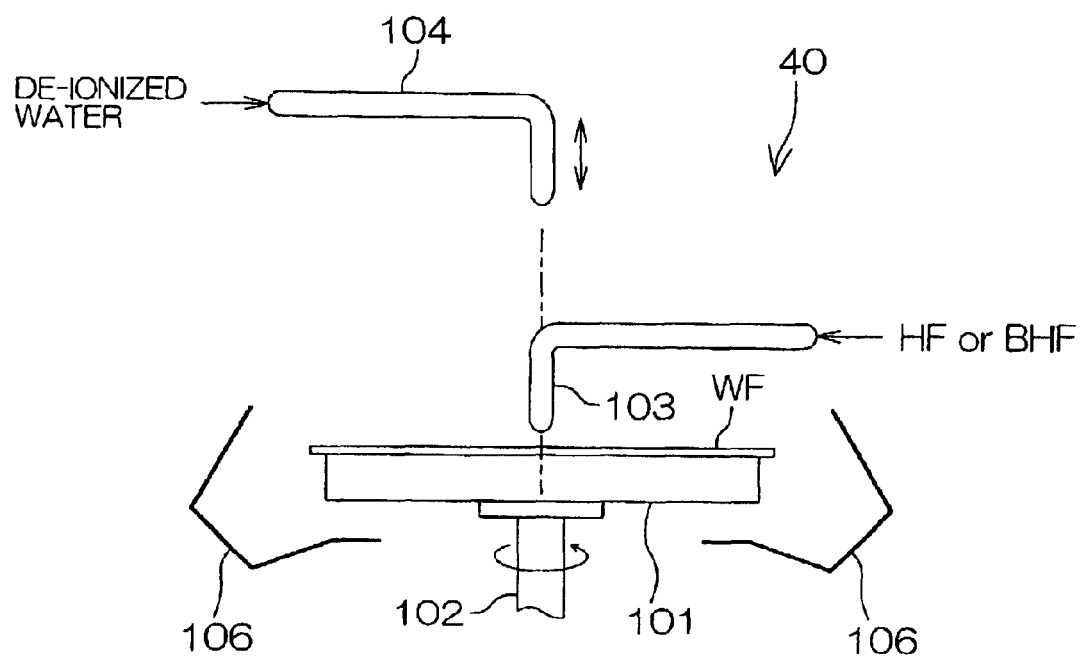
FIG. 14 is a schematic side view illustrating the arrangement of an etching processing section in the substrate processing apparatus in FIG. 13.

FIG. 14 is a schematic side view illustrating the arrangement of the etching processing section 40. The etching processing section 40 comprises a disk-like spin chuck 101 arranged to adsorb and hold the underside of a substrate WF, a rotational shaft 102 for rotating the spin chuck 101 around the vertical axis, an etching solution discharge nozzle 103 for supplying an etching solution (hydrofluoric acid or buffered hydrofluoric acid) to the center of rotation of the substrate WF held by the spin chuck 101, a de-ionized water discharge nozzle 104 for supplying pure water to the substrate WF held by the spin chuck 101 after the etching processing has been finished, and a scattering preventing cup 106 for receiving, around the spin chuck 101, a treating solution (etching solution or de-ionized water) scattered from the substrate WF, thus preventing the treating solution from scattering around.

The etching solution discharge nozzle 103 and the de-ionized water discharge nozzle 104 are vertically movable. Each of the nozzles 103, 104 can be moved between are treat position retreated away from the space above the spin chuck 101, and a processing position in close vicinity to the substrate WF held by the spin chuck 101 in the vicinity of the center of rotation of the substrate WF.

Figure 15:
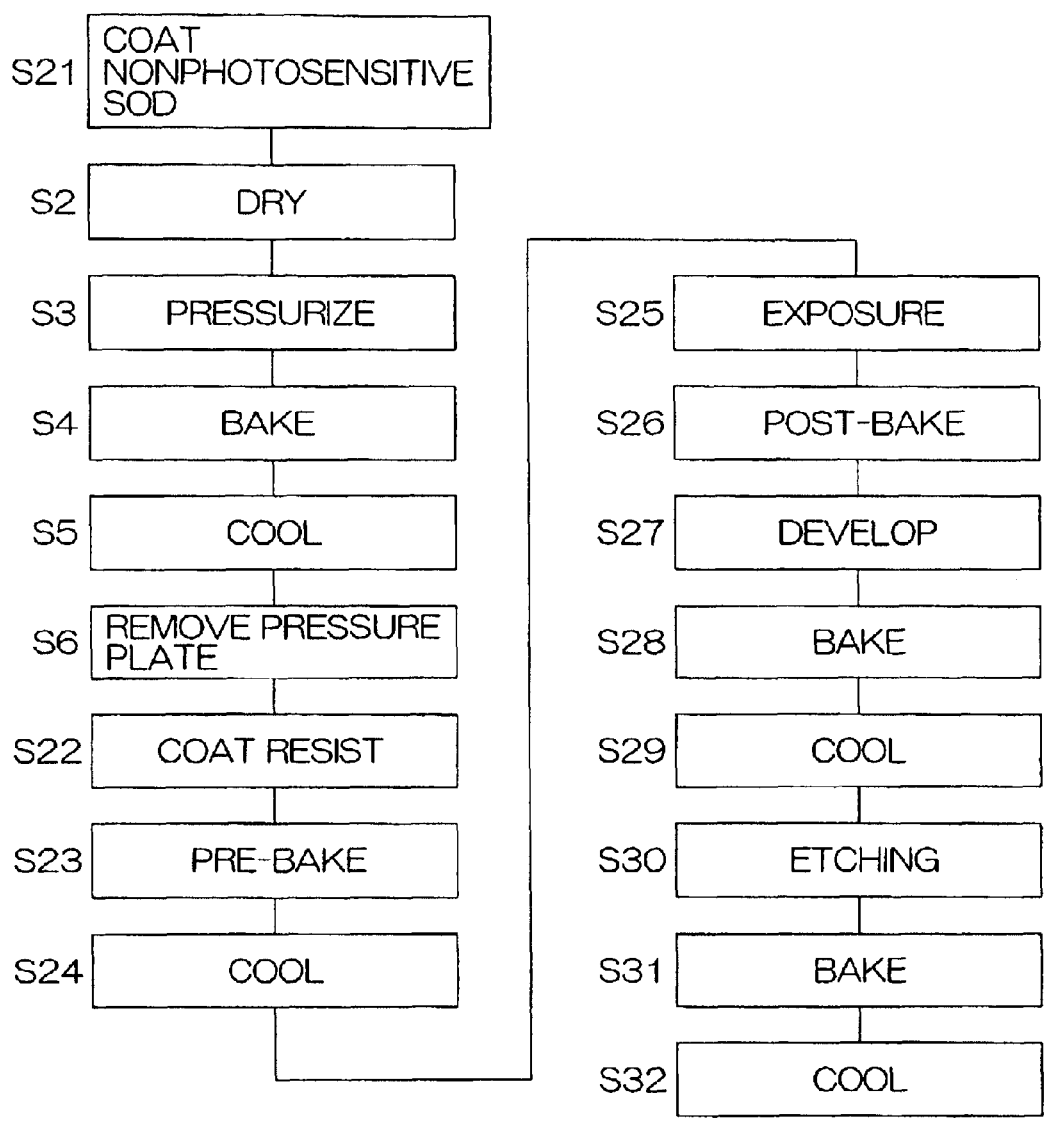
FIG. 15 is a flow chart illustrating an example of processing steps which can be executed by the substrate processing apparatus in FIG. 13.

FIG. 15 is a flow chart illustrating an example of processing steps which can be executed by the substrate processing apparatus shown in FIG. 13. In FIG. 15, like processing steps are designated by like reference numerals used in FIG. 12.

According to this embodiment, an etching processing can be executed. Accordingly, a substrate WF in the state shown in FIG. 11(c), is carried out from the cool plate CP and then carried in the etching processing section 40 by the main conveyance robot 21. In the etching processing section 40, the SOD film 31 is etched with the resist film serving as a mask (Step S30), thus forming openings 33 for interlayer wirings as shown in FIG. 11(d). Thereafter, the substrate WF is subjected, as necessary, to a heating processing (Step S31) and a cooling processing (Step S32). Then, the substrate WF is carried out from the temporary placing stand 5 and housed in the cassette CW2 by the indexer robot 12. The removal or separation of the resist film 32 is to be executed by another device.

In the foregoing, the description has been made of two embodiments of the present invention. However, the present invention can be embodied in other ways. For example, the description has been made of the embodiments in which an SOD film is used as an interlayer insulating film for multilayer wirings. However, a porous insulating film may be used as an interlayer insulating film. More specifically, a coating solution for a porous insulating film may be supplied for example by the nozzle 73 in the coating processing section 27. Due to its low dielectric constant, the porous insulating film has excellent properties as an interlayer insulating film, but is poor in mechanical strength. Accordingly, a porous insulating film cannot be applied to an interlayer insulating film according to prior art indispensably requiring a CMP process. According to the present invention, however, the coating film can be flattened by pressurizing a pressing plate thereto. It is therefore not inevitably required that the interlayer insulating film is high in mechanical strength. This enables a porous insulating film to be used as an interlaminar insulating film.

In each of the embodiments above-mentioned, there has been taken, as an example, a substrate processing apparatus for executing processings on a circular substrate typically represented by a semiconductor wafer. However, the present invention may also be applied to apparatus for executing processings on a rectangular substrate typically represented by a glass substrate for liquid-crystal-display-panel or the like.

Examples of the coating film to be formed on the substrate surface include, in addition to an SOD film and a resist film, an organic insulating film, a low dielectric interlayer insulating film, an SOG (Spin On Glass) film and the like.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This Application corresponds to Japanese Patent Application Serial No. 2001-307745 filed on Oct. 3, 2001 with the Japanese Patent Office, the disclosure of which is incorporated herein by reference.

What is claimed is:

1. A substrate processing apparatus comprising:
   a coating processing section for supplying a coating solution to a substrate;
   a heating processing section, provided at one side of a substrate conveyance passage, for driving the coating solution supplied on the substrate to form a coating film on the substrate;
   a pressure processing section, provided at the one side of the substrate conveyance passage, for pressurizing the coating film formed on the substrate; and
   a developing processing section for supplying a developing solution to the substrate having the coating film selectively exposed to light with a use of an exposure mask.

2. A substrate processing apparatus according to claim 1, wherein the pressure processing section causes a pressing plate having a flat face to be brought into pressure contact with the coating film, by moving the pressing plate and/or the substrate toward each other.

3. A substrate processing apparatus according to claim 2, wherein the pressure processing section includes a pressing plate holding mechanism for holding the pressing plate, a substrate holding mechanism for holding the substrate, and a pressurizing mechanism for moving the pressing plate holding mechanism and/or the substrate holding mechanism toward each other.

4. A substrate processing apparatus according to claim 3, further comprising a removing mechanism for removing the pressing plate from the substrate.

5. A substrate processing apparatus according to claim 4, wherein there is disposed a removal processing section having the removing mechanism.

6. A substrate processing apparatus according to claim 4, wherein the removing mechanism includes a mechanism for moving, after the pressing plate and the substrate have been brought into contact with each other, the pressing plate holding mechanism and/or the substrate holding mechanism away from each other with the pressing plate held by the pressing plate holding mechanism and with the substrate held by the substrate holding mechanism.

7. A substrate processing apparatus according to claim 1, wherein the coating processing section includes a photosensitive coating solution supplying portion for supplying a photosensitive coating solution onto the substrate.

8. A substrate processing apparatus according to claim 1, wherein the coating processing section includes a foundation film coating solution supplying portion for supplying a foundation film coating solution onto the substrate, and a photosensitive coating solution supplying portion for supplying a photosensitive coating solution onto the substrate having a foundation film formed thereon.

9. A substrate processing apparatus according to claim 8, further comprising an etching processing section for etching the foundation film present under a photosensitive coating film with the photosensitive coating film serving as a mask.

10. A substrate processing apparatus according to claim 1, wherein the coating processing section includes a porous coating film coating solution supplying portion for supplying, to the substrate, a coating solution for forming a porous coating film.

11. A substrate processing apparatus according to claim 1, wherein the heating processing section dries the coating solution, applied to the substrate by the coating processing section, to be gelatinous.

12. A substrate processing apparatus according to claim 1, further comprising a substrate conveying mechanism for conveying the substrate at least from the heating processing section to the pressure processing section through the substrate conveyance passage.

13. A substrate processing method comprising:

a coating solution supplying step of supplying a photosensitive coating solution to a surface of a substrate;

a coating film forming step, after the coating solution supplying step, of drying the coating solution supplied to the substrate surface to form a coating film on the substrate surface, the coating film forming step comprising a step of heating the coating solution on the substrate in a heating processing section provided at one side of a substrate conveyance passage;

a substrate conveying step of conveying the substrate from the heating processing section to a pressure processing section provided at the one side of the substrate conveyance passage;

a pressurizing step of pressurizing, after the coating film forming step and the substrate conveying step, the coating film formed on the substrate surface by a pressing plate being in contact therewith, thus shaping the surface of the coating film, the pressurizing step being performed in the pressure processing section;

a pressing plate removing step of removing, after the pressurizing step, the pressing plate from the coating film;

an exposure step of exposing, after the pressing plate removing step, the coating film to light in a predetermined pattern; and a developing step of supplying, after the exposure step, a developing solution to the substrate having the coating film, thus corroding the coating film in a predetermined pattern.

14. A substrate processing method according to claim 13, wherein the coating film forming step includes a step of drying the coating solution on the substrate to be gelatinous.

15. A substrate processing method comprising:

a nonphotosensitive coating solution supplying step of supplying a nonphotosensitive coating solution to a surface of a substrate;

a nonphotosensitive coating film forming step, after the nonphotosensitive coating solution supplying step, form a nonphotosensitive coating solution supplied to the substrate surface to form a nonphotosensitive coating film on the substrate surface, the nonphotosensitive coating film forming step comprising a step of heating the coating solution on the substrate in a heating processing section provided at one side of a substrate conveyance passage;

a substrate conveying step of conveying the substrate from the heating processing section to a pressure processing section provided at the one side of the substrate conveyance passage;

a pressurizing step of pressurizing, after the nonphotosensitive coating film forming step and the substrate conveying step, the nonphotosensitive coating film formed on the substrate surface by a pressing plate being in contact therewith, thus shaping the surface of the nonphotosensitive coating film, the pressurizing step being performed in the pressure processing section;

a pressing plate removing step of removing, after the pressurizing step, the pressing plate from the nonphotosensitive coating film;

a photosensitive coating film forming step of supplying, after the pressing plate removing step, a photosensitive coating solution onto the nonphotosensitive coating film, thus forming a photosensitive coating film;

an exposure step of exposing, after the photosensitive coating film forming step, the photosensitive coating film to light in a predetermined pattern; and a developing step of supplying, after the exposure step, a developing solution to the substrate having the photosensitive coating film, thus corroding the photosensitive coating film in a predetermined pattern.

16. A substrate processing method according to claim 15, further comprising, after the developing step, an etching step of etching the nonphotosensitive coating film, with the photosensitive coating film, corroded in the predetermined pattern, serving as a mask.

17. A substrate processing method according to claim 15, wherein the nonphotosensitive film forming step includes a step of drying the nonphotosensitive coating solution on the substrate to be gelatinous.

* * * * *